(12) United States Patent
Edme et al.

(10) Patent No.: US 6,849,823 B2
(45) Date of Patent: Feb. 1, 2005

(54) ARRANGEMENT AND METHOD FOR PROCESSING ELECTRICAL SUBSTRATES USING LASERS

(75) Inventors: Sebastien Edme, Wissembourg (FR); Stefan Lesjak, Ettlingen (DE); Eddy Roelants, Brugge (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/663,916

(22) Filed: Sep. 17, 2003

(65) Prior Publication Data

US 2004/0164057 A1 Aug. 26, 2004

(30) Foreign Application Priority Data

Feb. 20, 2003 (DE) .......................................... 103 07 309

(51) Int. Cl.$^7$ .......................... B23K 26/38; B23K 26/40
(52) U.S. Cl. .................................................. 219/121.7
(58) Field of Search ........................ 219/121.67, 121.68, 219/121.7, 121.71; 438/463, 940

(56) References Cited

U.S. PATENT DOCUMENTS

| | | | |
|---|---|---|---|
| 4,761,786 A | * | 8/1988 | Baer ........................... 372/10 |
| 5,593,606 A | | 1/1997 | Owen et al. |
| 6,541,731 B2 | * | 4/2003 | Mead et al. .............. 219/121.7 |
| 6,576,869 B1 | * | 6/2003 | Gower et al. .......... 219/121.71 |
| 6,756,563 B2 | * | 6/2004 | Gross et al. ............. 219/121.7 |
| 6,781,090 B2 | * | 8/2004 | Sun et al. .............. 219/121.71 |

FOREIGN PATENT DOCUMENTS

| | | |
|---|---|---|
| EP | 931 439 B1 | 6/2000 |
| EP | 1 115 031 A2 | 7/2001 |

\* cited by examiner

*Primary Examiner*—Samuel M. Heinrich
(74) *Attorney, Agent, or Firm*—Harness, Dickey & Pierce, P.L.C.

(57) ABSTRACT

For processing electric circuit substrates, a laser source with a diode-pumped. quality-controlled, pulsed solid-state laser is used. The laser is able to emit laser radiation with a wavelength between 266 nm and 1064 nm, a pulse repetition rate between 1 kHz and 1 MHz and a pulse length of 30 ns to 200 ns with an average laser power between 1 W and around 5 W. Pre-specified operating modes can be set via a controller, depending on an area of application, with the appropriate different combinations of laser power and repetition rate. Thus, the same laser can optionally be used to perform a drilling operation, an etch removal operation or an exposure operation. Using a galvo mirror deflector unit that can also be controlled via the deflection unit, the laser beam may be deflected on the substrate in accordance with the relevant operating mode.

23 Claims, 3 Drawing Sheets

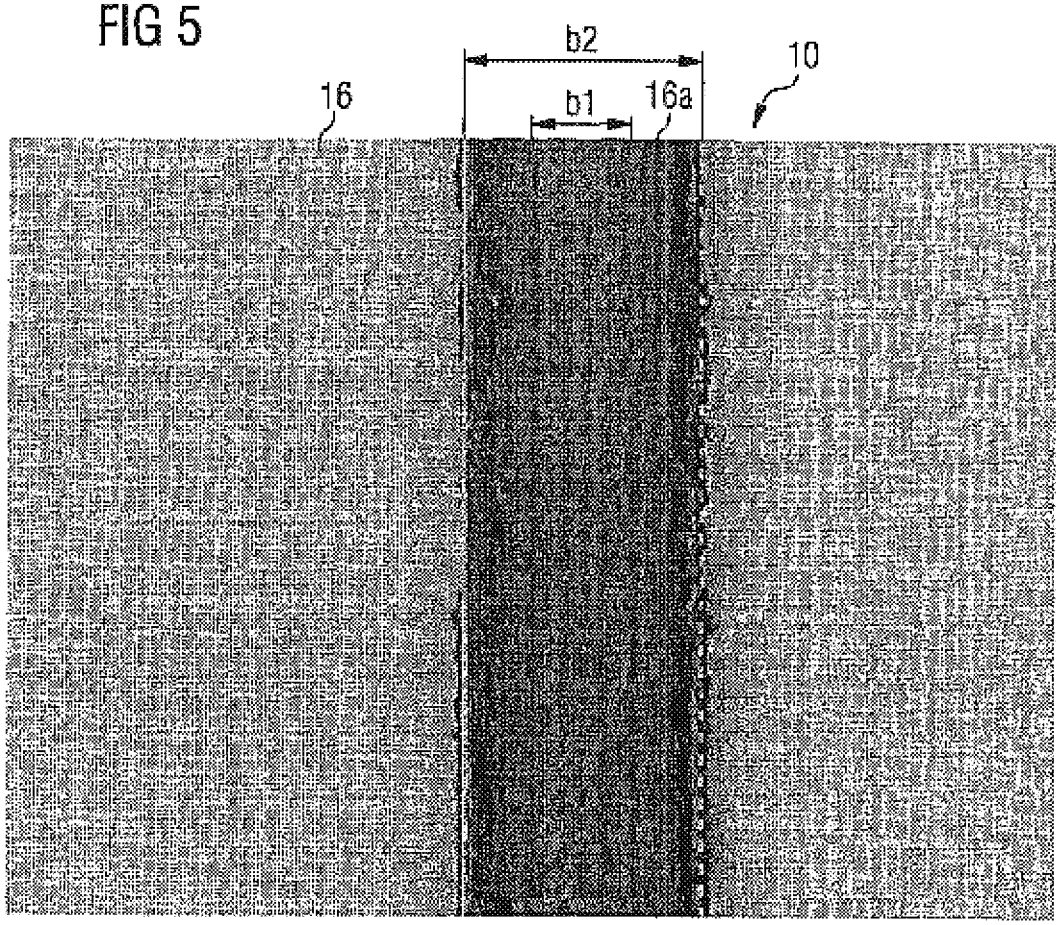

ARRANGEMENT AND METHOD FOR PROCESSING ELECTRICAL SUBSTRATES USING LASERS

The present application hereby claims priority under 35 U.S.C. §119 on German patent application number DE 10307309.4 filed Feb. 20, 2003, the entire contents of which are hereby incorporated herein by reference.

FIELD OF THE INVENTION

The invention generally relates to an arrangement and a method for processing electrical substrates. Preferably, it includes
- a work piece holder for holding and positioning the substrate,
- a laser source with a diode-pumped, quality-controlled, pulsed, solid-state laser,
- a deflection unit,
- an imaging unit and
- a controller to set the operating variables of the laser.

BACKGROUND OF THE INVENTION

It is basically known that the energy of a laser beam can be used in processing circuit boards and comparable types of electrical circuit substrates. The use of a UV laser with a continuously pumped, quality switched Nd.YAG laser for drilling microholes in a multilayer substrate is known from U.S. Pat. No. 5,593,606. Typical repetition rates of up to 5 kHz are used here.

A method of forming at least two wiring layers on piezoelectric isolated sublayers is known from EP 931 439 B1, whereby a laser, preferably an Nd-YAG, is used both for drilling blind holes and for structuring conductor tracks. When conductor tracks are formed either the metal layer itself can be structured by the laser by partial removal or its is also possible to partially remove an etch resist layer lying on the metal layer with the laser and then etch off the area of the metal layer revealed.

Basically it is also known that laser beams can be used to expose photo resist layers. It is proposed in EP 1 115 031 A2 for this purpose to use a titanium-sapphire laser with repetition rates of more than 80 MHz which generates a quasi-continuous UV laser beam.

Depending on the application different laser systems are accordingly used which require significant investment outlay if different processing methods are to be used one after the other in circuit board manufacturing.

SUMMARY OF THE INVENTION

An object of an embodiment of the invention is to specify a laser system and a corresponding laser processing method which makes it possible to process substrates with a wide variety of laser methods without expensive additional investment and costly upgrades.

In accordance with an embodiment of the invention, an object may be achieved with the arrangement for processing electrical circuit substrates with
- a work piece holder for holding and positioning the substrate,
- a laser source with a diode-pumped, quality controlled, pulsed solid-state laser of a wavelength between 266 and 1064 nm, able to deliver laser radiation within the following ranges of values:
    a pulse repetition rate between 1 kHz and 1 MHz,
    a pulse length of 30 ns to 200 ns and
    an average laser power of around 0.1 to approx. 5 W,
- further with a deflection unit, which allows deflection speeds of up to 600 mm/s,
- an imaging unit and
- a controller which is in a position, depending on the application for the laser. to operate the laser with different combinations of average laser power and repetition rates.

By selecting the laser in accordance with an embodiment of the invention with a previously unknown spectrum of key values and a controller which is able to set a specified combination of key data for the type of substrate processing envisaged, it is possible to perform from a single laser source all the laser processing steps possible for circuit board processing, such as drilling, removal of metal layers or of etch resist layers, through to merely illuminating of photo-sensitive pastes. This simplifies the outlay for the provision of fabrication equipment and for upgrades between the different fabrication steps.

Preferably the arrangement in accordance with an embodiment of the invention is operated with a laser with a wavelength of between 350 and 550 nm, especially a UV laser with a 355 nm wavelength.

As mentioned, specified combinations of key laser data can be provided for processing steps being considered. The laser can thus feature a first operating mode for removing layers in which it is operated with an average laser power of around 1 to 2 W and a repetition rate of around 60 to 80 kHz. In this case it should be pointed out that the slightly higher laser power and the slightly lower repetition rate for structuring of for example metallic layers and the slightly lower laser power of around 1 W with the slightly higher repetition rate of 80 kHz for the removal of non-metallic layers, such as solder resist, can be combined. In a second operating mode for drilling of holes in metallic and electrical layers of the circuit substrate, the laser can typically be set to a medium power of 3 to 4 W and a repetition rate of 10 to 30 kHz. In a third operating mode for exposing photosensitive layers the laser is set to a far lower laser power in the order of magnitude of around 100 mW with a repetition rate of 200 kHz to 1 MHz.

A galvanometer mirror unit can usefully be employed as a deflection unit, allowing high deflection speeds of typically 300 to 600 mm/s. With a suitable combination of laser power and spot diameter a significantly higher deflection speed can also be set. With these speeds the laser beam will essentially be moved linearly for structuring layers, whereas for drilling circular movements will be executed in the familiar way.

A method in accordance with an embodiment of the invention for processing an electrical circuit substrate, whereby a laser with a wavelength of between around 266 and around 1064 nm, a pulse repetition rate of between 1 kHz and 1 MHz, a pulse length of between 30 ns and 200 ns and an average laser power of between around 0.1 W and around 5 W is used, features the following steps:
- the substrate is fixed on the work piece holder and positioned.
- the laser beam is set via a controller to one of the following operating modes:
    a) Drilling of holes with an average laser power of 3 to 5 W, a repetition rate of around 10 to 30 kHz and a pulse length of around 30 to 50 ns,
    b) Structuring of metallic or dielectric layers with an average laser power of 1 to 2 W, a repetition rate of around 50 to 90 kHz, preferably 60 to 80 kHz, and a pulse length of around 50 to 60 ns, c) Illuminating a photo-sensitive layer with an average laser power of approaching 0.1 W, a repetition rate of 200 kHz to 1 MHz and a pulse length of 100 to 200 ns, preferably 120 ns, the substrate is processed with the laser beam in the operating mode set, whereby the laser beam is moved at a speed of 300 to 600 mm/s with a galvo mirror deflection unit.

In a preferred embodiment the photo-sensitive layer illuminated in operating mode c) is exposed in a further step, and thereafter the non-exposed surfaces of the layer are removed.

BRIEF DESCRIPTION OF THE DRAWINGS

The present invention will become more fully understood from the detailed description of preferred embodiments given hereinbelow and the accompanying drawings, which are given by way of illustration only and thus are not limitative of the present invention, and wherein.

DETAILED DESCRIPTION OF THE PREFERRED EMBODIMENTS

Figure 1:
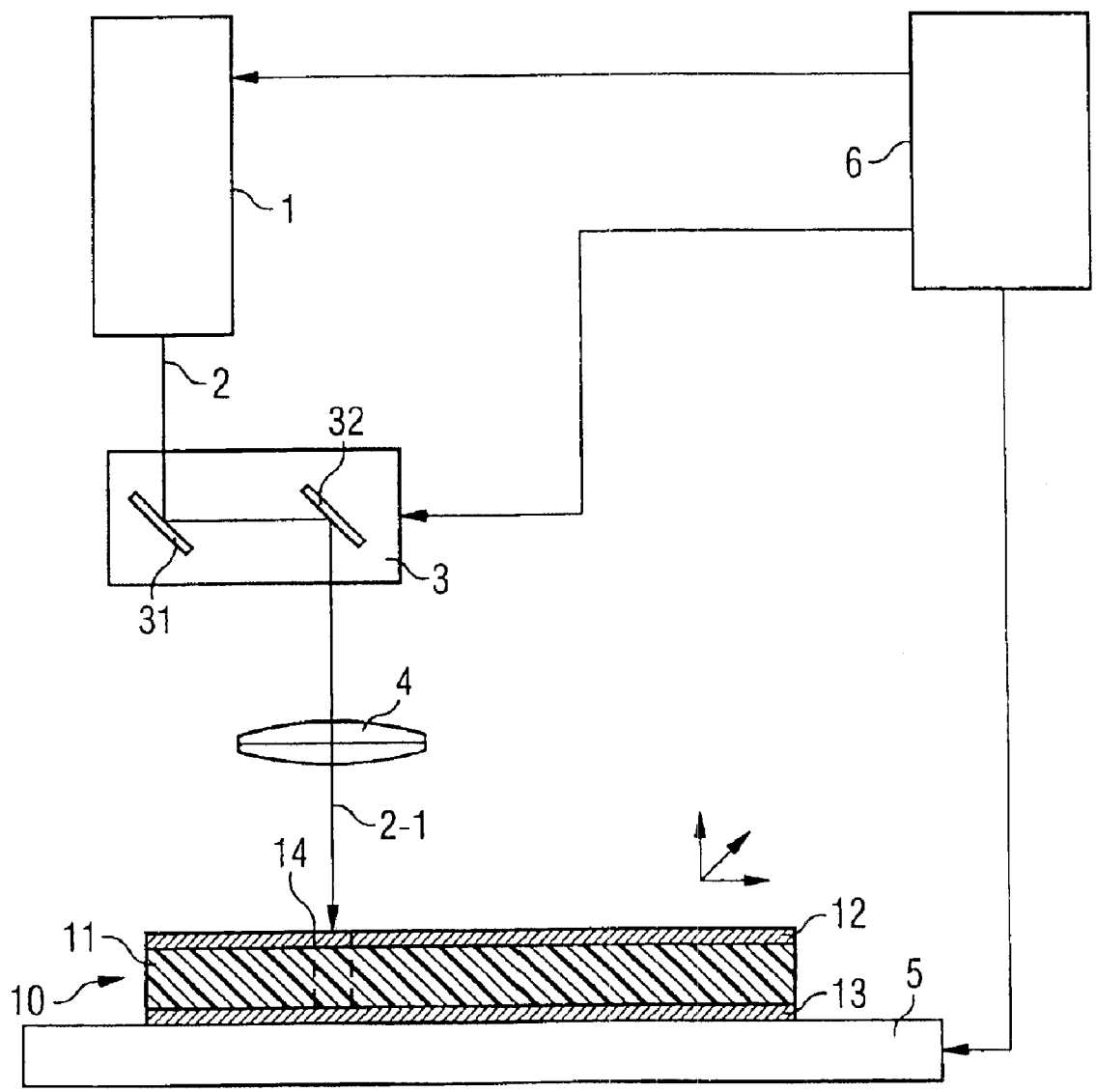
FIG. 1 the schematic structure of a laser processing machine designed in accordance with an embodiment of the invention, with a substrate intended for drilling of holes, FIG. 2 a schematic of a substrate in which an solder resist layer is structured with the laser beam and the release sample is then etched, FIG. 3 a schematic of a substrate in which a metallic surface layer is structured directly with the laser beam, FIG. 4 a schematic of a substrate in which a photosensitive layer applied to a metal layer is exposed using the laser, and FIG. 5 a top view of a substrate on which, in accordance with FIG. 4, a track is exposed with a laser and then washed out.

FIG. 1 is a schematic diagram of a laser processing arrangement. At its heart is a laser 1 which is designed as a diode-pumped, pulsed solid-state laser for the purposes of an embodiment of the invention The laser beam 2 emitted from this laser source is directed via a deflection unit 3 with two galvo mirrors 31 and 32 and an imaging unit 4, preferably formed from a lens, onto a substrate 10 which is arranged on a holder device 5, preferably a positioning table that can be adjusted in all directions. A controller 6 is used to control the arrangement, which controls both laser 1 and also deflection unit 3 and holder 5 according to the processing desired.

As a rule the work piece, namely the substrate, is moved using the holder device 5, i.e. the positioning table, in a horizontal direction into a position such that a specified field of the substrate to be processed comes into the area of operation of laser beam 2 (X-Y positioning). In addition it is possible, through vertical adjustment of positioning table 5 to bring the substrate, depending on the desired focusing of the laser beam into the focusing of the imaging unit or into a specified distance from focus. During laser processing the substrate will be held in a set position since the movements to the field to be processed are undertaken via deflection of the laser beam via the deflection unit 3. Deflection via the galvo mirror allows significantly greater speeds to be achieved than through adjustment of positioning surface 5 which has a relatively large mass. The deflection of laser beam 2 to the field to be processed of substrate 10 is thus undertaken by controller 6 via galvo mirrors 31 and 32. Further programs are stored in the controller with which laser 1 can be adjusted to specific combinations of power data for the relevant purpose.

In the example shown in FIG. 1 it is assumed that in substrate 10 holes, known as vias, are to be drilled in the form of through holes or blind holes. The substrate has a middle dielectric layer 11 as well as on its top and bottom side a metallic layer 12 or 13. If one assumes that a blind hole 14 is to be drilled through metallic layer 12 and dielectric layer 11, the laser is adjusted so that it delivers an average laser power of for example 3.5 to 4 W at a repetition rate of 10 to 30 kHz and a pulse length of 30 to 50 ns. In this case the laser itself is preferably a UV laser with 355 nm wavelength. However a laser with a wavelength of 532 nm could be used. if the laser is now set to the specified power for the drilling mode, the required holes 14 are drilled into the substrate, whereby for example the laser beam must perform a specific number of circular movements in order to remove the metallic layer on the one hand and the dial electric layer on the other hand in the desired drilled hole.

Figure 2:
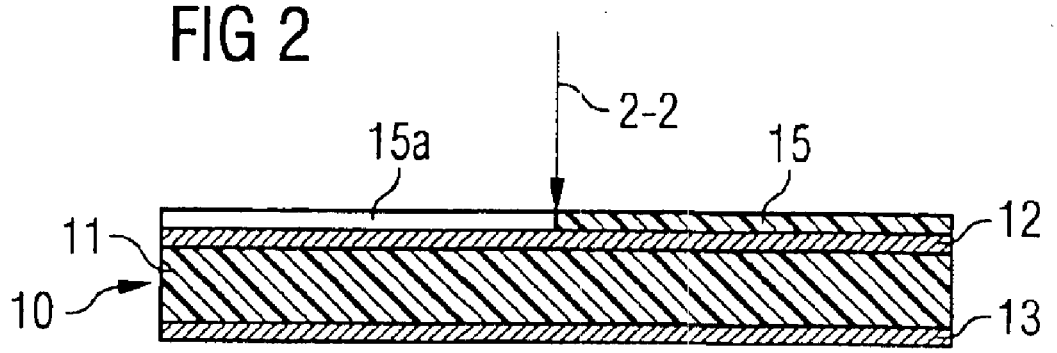

If in another operation on substrate 10 structuring by etching of conductor tracks is to be undertaken, the, in accordance with FIG. 2 an etch resist layer 15 can first be applied to the metallic layer 12 which is removed in accordance with a specified pattern in areas 15a so that in these areas the metallic layer is revealed and can then be etched away. The laser beam which is shown in this Figure as 2—2 is set via the controller in such a way that, to remove the etch resist, it typically features and average laser power of around 1 W at a repetition rate of 80 kHz and a pulse length of 60 ns. These values are only example specifications since the precise setting depends individually on the layer to be removed, its properties, its thickness and the like.

Figure 3:
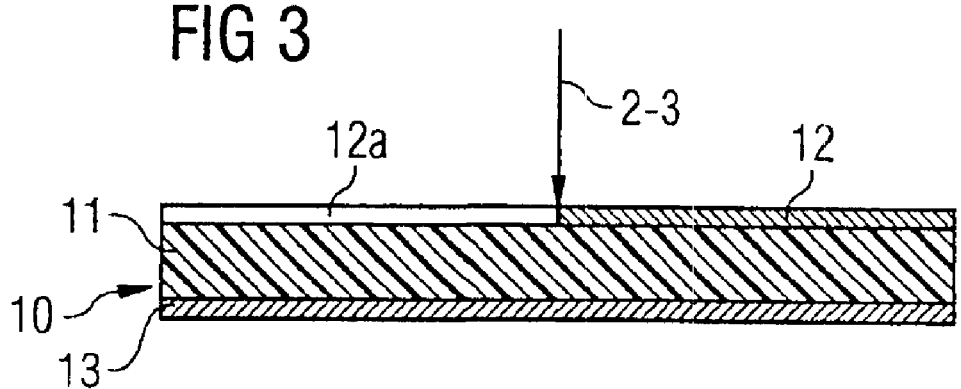

FIG. 3 shows an example of how a laser beam 2-3 is used to structure a metallic layer 12 directly according to a specified conductor track pattern, i.e. partially remove it. The metallic layer 12 thus only remains intact where conductor tracks are required, whereas in the areas 12a the dielectric layer 11 is revealed. For this purpose the laser beam 2–3 is adjusted via the control device so that for example it features an average power of 1.5 W at a repetition rate of 60 kHz and a pulse length of around 50 ns. In this case too the exact setting depends on the properties and thickness of the metallic layer 12 to be removed.

Figure 4:
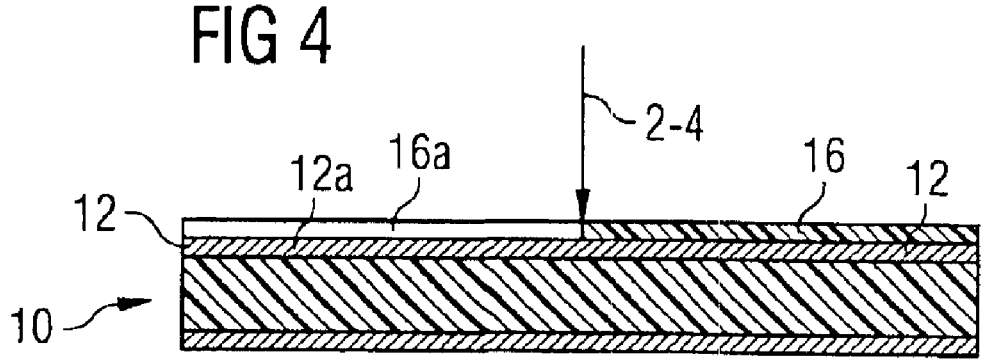

FIG. 4 finally shows how structuring can be undertaken on a substrate by the use of photolithography. This is done by first applying a photosensitive layer 16 to the metallic layer 12 which is exposed with a laser beam 2–4 in specified areas 16a. The exposed layer is then developed and washed out so that underlying metallic layer areas 12a are revealed and can be etched off.

FIG. 5 shows a photo taken from above of a substrate 10 with a photosensitive layer 16, which has been exposed with a laser beam in area 16a and then washed out. In this example a photoresist known under the trade name of Probelec with a sensitivity of 1200 mJ/cm$^2$ at a laser wavelength of 355 nm has been used. It has been exposed with a frequency-tripled, diode-pumped semiconductor laser with a wavelength of 355 nm, a repetition rate of 200 kHz and a pulse duration of around 100–200 ns with an average laser power of around 100 mW. With a speed of deflection of around 100 to 600 nm/s a line width of about 30 μm has thus been exposed.

In FIG. 5 it can be seen that despite the pulse-shaped applications with the laser light a mainly straight edge line of the exposed strip 16a is achieved. One can detect from an inner strip with width b1, in which after the washing out the copper layer 12 (FIG. 4) emerges particularly cleanly and the entire strip of the exposure with width b2, of which the edge areas in accordance with the energy distribution of the laser beam are a little more weakly illuminated, but are still sufficiently exposed and have then been removed so that the full width of the metallic strip b2 can be etched off.

Through this option provided by an embodiment of the invention, exposure can be undertaken with the same laser device as is used for structuring and drilling. In this case the lines and spaces that can be achieved are specified by the diameter of the focused laser spot, as well as by the sensitivity of the photo resists and the repetition rate of the laser pulse. Looked at mathematically, the line width that can be achieved is a folding of the spatial beam distribution in focus with the spectral sensitivity of the photo resist. Although the method involves a pulsed laser beam, a straight consistent line is achieved by overlaying the consecutive pulses. A corresponding setting of the laser repetition rate and speed of deflection of the galvo resist indicates that the photo resist is not removed but is exposed, so that the effect achieved is the same as that of the frequently used cw-$Ar^+$ laser. With the values specified above line widths of around 30 μm can be created for example.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An arrangement for processing an electrical circuit substrate, comprising:
   a work piece holder, adapted to hold and position the substrate;
   a laser source including a diode-pumped, quality controlled, pulsed solid-state laser of a wavelength between 266 nm and 1064 nm, and adapted to emit laser radiation in the following ranges of values,
   a pulse repetition rate of between 1 kHz and 1 MHz,
   a pulse length of 30 ns to 200 ns, and
   an average laser power of around 0.1 to approximately 5 W;
   a deflection unit arranged in a beam input of the laser, allowing deflection speeds of up to 600 mm/s;
   an imaging unit; and
   a controller adapted to operate the laser, depending on an application for the laser, with different combinations of average laser power and repetition rates.

2. An arrangement as claimed in claim 1, wherein the laser has a wavelength of between 350 and 550 nm.

3. An arrangement as claimed in claim 1, wherein the laser includes a first mode of operation to remove layers, in which it is operated with an average laser power of around 1 to 2 W and a repetition rate of around 60 to 80 kHz.

4. An arrangement as claimed in claim 1, wherein the laser includes an operating mode for drilling holes in metallic and dielectric layers of the circuit substrate, in which it is operated with an average laser power of 3 to 4 W and a repetition rate of 10 to 30 kHz.

5. An arrangement as claimed in claim 1, wherein the laser includes an operating mode to expose the photosensitive layers, in which it is operated with an average laser power in the order of magnitude of 100 mW and a repetition rate of 200 kHz to 1 MHz.

6. An arrangement as claimed in claim 1, wherein a galvanometer mirror unit is used as the deflection unit with a speed of deflection of 100 to 600 mm/s.

7. An arrangement as claimed in claim 1, wherein the laser is a UV laser with a 355 nm wavelength.

8. An arrangement as claimed in claim 2, wherein the laser includes a first mode of operation to remove layers, in which it is operated with an average laser power of around 1 to 2 W and a repetition rate of around 60 to 80 kHz.

9. An arrangement as claimed in claim 2, wherein the laser includes an operating mode for drilling holes in metallic and dielectric layers of the circuit substrate, in which it is operated with an average laser power of 3 to 4 W and a repetition rate of 10 to 30 kHz.

10. An arrangement as claimed in claim 3, wherein the laser includes a second operating mode for drilling holes in metallic and dielectric layers of the circuit substrate, in which it is operated with an average laser power of 3 to 4 W and a repetition rate of 10 to 30 kHz.

11. An arrangement as claimed in claim 2, wherein the laser includes an operating mode to expose the photosensitive layers, in which it is operated with an average laser power in the order of magnitude of 100 mW and a repetition rate of 200 kHz to 1 MHz.

12. An arrangement as claimed in claim 10, wherein the laser includes a third operating mode to expose the photosensitive layers, in which it is operated with an average laser power in the order of magnitude of 100 mW and a repetition rate of 200 kHz to 1 MHz.

13. An arrangement as claimed in claim 2, wherein a galvanometer mirror unit is used as the deflection unit with a speed of deflection of 100 to 600 mm/s.

14. An arrangement as claimed in claim 12, wherein a galvanometer mirror unit is used as the deflection unit with a speed of deflection of 100 to 600 mm/s.

15. An arrangement for processing a substrate, comprising:
   means for holding and positioning the substrate;
   a laser of a wavelength between 266 nm and 1064 nm, and adapted to emit laser radiation in the following ranges of values,
   a pulse repetition rate of between 1 kHz and 1 MHz,
   a pulse length of 30 ns to 200 ns, and
   an average laser power of around 0.1 to approximately 5 W;
   means for deflecting the laser at speeds of up to 600 mm/s; and
   means for operating the laser, depending on an application for the laser, with different combinations of average laser power and repetition rates.

16. An arrangement as claimed in claim 15, wherein the laser has a wavelength of between 350 and 550 nm.

17. An arrangement as claimed in claim 15, wherein the laser includes a first mode of operation to remove layers, in which it is operated with an average laser power of around 1 to 2 W and a repetition rate of around 60 to 80 kHz.

18. An arrangement as claimed in claim 17, wherein the laser includes a second operating mode for drilling holes in metallic and dielectric layers of the circuit substrate, in which it is operated with an average laser power of 3 to 4 W and a repetition rate of 10 to 30 kHz.

19. An arrangement as claimed in claim 18, wherein the laser includes a third operating mode to expose the photosensitive layers, in which it is operated with an average laser power in the order of magnitude of 100 mW and a repetition rate of 200 kHz to 1 MHz.

20. An arrangement as claimed in claim 15, wherein a galvanometer mirror unit is used as the deflection means with a speed of deflection of 100 to 600 mm/s.

21. An arrangement as claimed in claim 15, wherein the laser is a UV laser with a 355 nm wavelength.

22. An arrangement as claimed in claim 15, further comprising an imaging unit.

23. An arrangement for processing a substrate, comprising:
- a solid-state laser of a wavelength between 266 nm and 1064 nm, and adapted to emit laser radiation in the following ranges of values,
  - a pulse repetition rate of between 1 kHz and 1 MHz,
  - a pulse length of 30 ns to 200 ns, and
  - an average laser power of around 0.1 to approximately 5 W;
- a deflection unit, adapted to deflect the laser at speeds of up to 600 mm/s; and
- a controller adapted to operate the laser, depending on an application for the laser, with different combinations of average laser power and repetition rates.

* * * * *